(12) United States Patent
Lin

(10) Patent No.: US 6,518,123 B2
(45) Date of Patent: Feb. 11, 2003

(54) SPLIT GATE FIELD EFFECT TRANSISTOR (FET) DEVICE WITH ANNULAR FLOATING GATE ELECTRODE AND METHOD FOR FABRICATION THEREOF

(75) Inventor: Boson Lin, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/881,517

(22) Filed: Jun. 14, 2001

(65) Prior Publication Data

US 2002/0192908 A1 Dec. 19, 2002

(51) Int. Cl.⁷ .............................................. H01L 21/336
(52) U.S. Cl. ........................ 438/257; 438/257; 438/259; 257/315
(58) Field of Search ................................. 438/257–267, 438/202, 211; 257/314–321

(56) References Cited

U.S. PATENT DOCUMENTS 5,427,968 A    6/1995  Hong
6,051,860 A    4/2000  Odanaka et al.
6,157,060 A   12/2000  Kerber
6,329,248 B1 * 12/2001  Yang ........................... 438/267
2002/0048882 A1 * 4/2002  Wen ............................ 438/267

* cited by examiner

Primary Examiner—David Nelms
Assistant Examiner—Long Tran
(74) Attorney, Agent, or Firm—Tung & Associates

(57) ABSTRACT

Within a split gate field effect transistor (FET) device and a method for fabricating the split gate field effect transistor (FET) device there is employed at least one of: (1) an annular shaped floating gate electrode formed with a spacer shaped cross-section having a tip at its upper outer periphery; and (2) a pair of source/drain regions formed into a semiconductor substrate adjacent a pair of opposite sides of the annular shaped floating gate electrode, where one of the pair of source/drain regions is formed further beneath the annular shaped floating gate electrode than the other of the pair of source/drain regions. The split gate field effect transistor (FET) device is formed with enhanced properties, such as decreased dimensions and enhanced coupling.

11 Claims, 2 Drawing Sheets

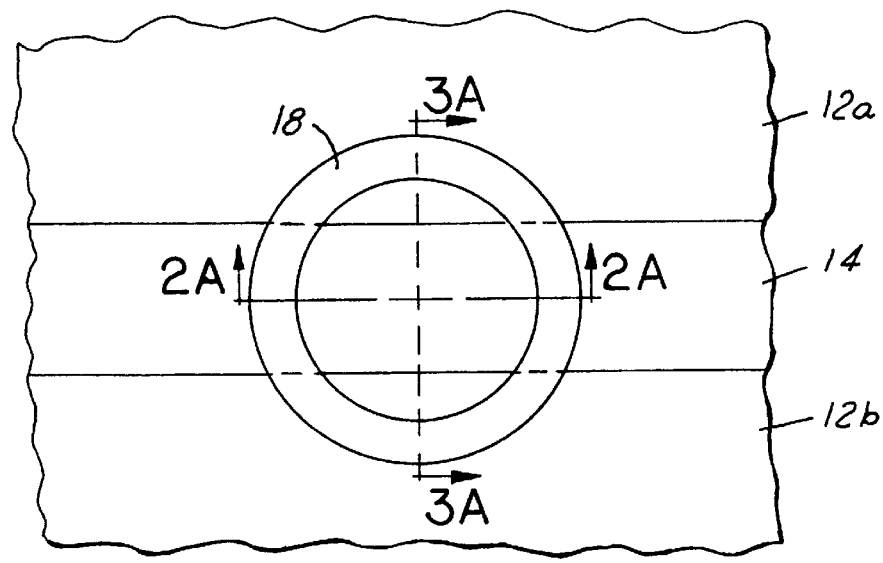
FIG.1
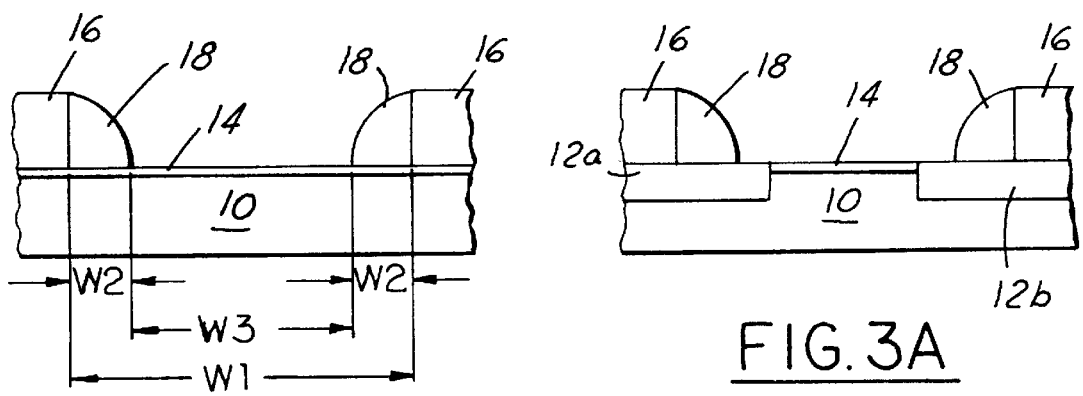
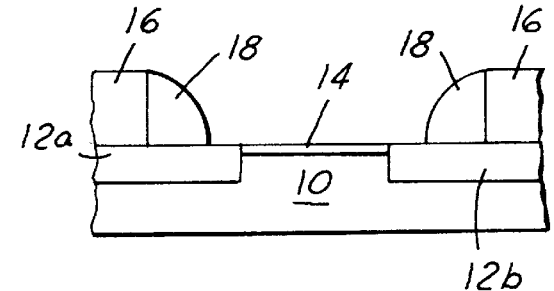
FIG.3A
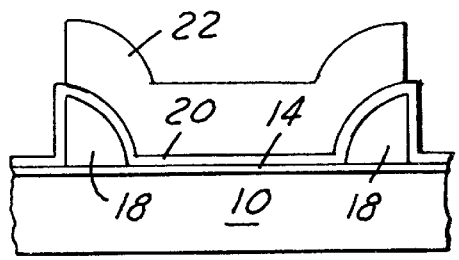
FIG.2A
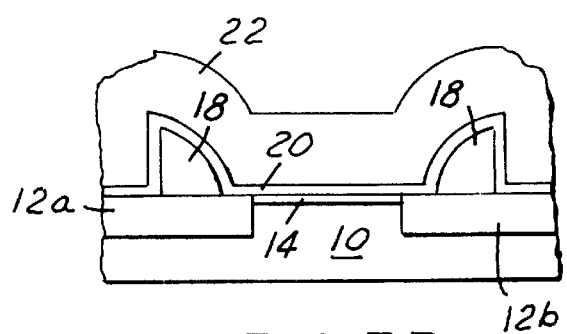
FIG.2B  FIG.3B

SPLIT GATE FIELD EFFECT TRANSISTOR (FET) DEVICE WITH ANNULAR FLOATING GATE ELECTRODE AND METHOD FOR FABRICATION THEREOF

BACKGROUND OF THE INVENTION

1. Field of the Invention

The present invention relates generally to methods for fabricating split gate field effect transistor (FET) devices, as employed within semiconductor integrated circuit microelectronic fabrications. More particularly, the present invention relates to methods for fabricating, with enhanced properties, split gate field effect transistor (FET) devices, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer (which in part serves as a tunneling dielectric layer) and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce, reduce or sense charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to form within non-volatile semiconductor integrated circuit microelectronic fabrications split gate field effect transistor (FET) devices with enhanced properties, such as but not limited to decreased dimensions and enhanced coupling, insofar as split gate field effect transistor (FET) devices are formed employing a plurality of microelectronic layers which may not otherwise be optimally registered with respect to each other.

It is thus towards the goal of providing for use within semiconductor integrated circuit microelectronic fabrications, and in particular within semiconductor integrated circuit microelectronic memory fabrications, split gate field effect transistor (FET) devices with enhanced properties that the present invention is directed.

Various non-volatile semiconductor integrated circuit microelectronic devices having desirable properties, and methods for fabrication thereof, have been disclosed within the art of non-volatile semiconductor integrated circuit microelectronic fabrication.

Included among the non-volatile semiconductor integrated circuit microelectronic devices and methods for fabrication thereof, but not limited among the non-volatile semiconductor integrated circuit microelectronic devices and methods for fabrication thereof, are non-volatile semiconductor integrated circuit microelectronic devices and methods for fabrication thereof as disclosed within: (1) Hong, in U.S. Pat. No. 5,427,968 (a split gate field effect transistor (FET) device and method for fabrication thereof which employs a pair of separated and self-aligned tunneling dielectric layers in conjunction with an annular shaped floating gate electrode, such as to provide for increased programming/erasing cycling within the split gate field effect transistor (FET) device); (2) Odanaka et al., in U.S. Pat. No. 6,051,860 (a non-volatile semiconductor integrated circuit microelectronic device and method for fabrication thereof which employs a stepped topographic channel region having a non-uniform dopant concentration therein, in order to provide for enhanced electron injection into a floating gate formed over the stepped topographic channel region); and (3) Kerber, in U.S. Pat. No. 6,157,060 (a split gate field effect transistor (FET) device and method for fabrication thereof which employs a pillar shaped channel region having formed surrounding thereupon an annular shaped floating gate electrode such as to provide the split gate field effect transistor (FET) device with enhanced density).

Desirable within the art of non-volatile semiconductor integrated circuit microelectronic fabrication, and in particular within the art of non-volatile semiconductor integrated circuit microelectronic memory fabrication, are additional methods and materials which may be employed for forming split gate field effect transistor (FET) devices with enhanced properties.

It is towards the foregoing object that the present invention is directed.

SUMMARY OF THE INVENTION

A first object of the present invention is to provide a split gate field effect transistor (FET) device and a method for fabricating the split gate field effect transistor (FET) device.

A second object of the present invention is to provide the split gate field effect transistor (FET) device and the method for fabricating the split gate field effect transistor (FET) device in accord with the first object of the present invention, wherein the split gate field effect transistor (FET) device is fabricated with enhanced properties.

A third object of the present invention is to provide the split gate field effect transistor (FET) device and the method for fabricating the split gate field effect transistor (FET) device in accord with the first object of the present invention and the second object of the present invention, wherein the method for fabricating the split gate field effect transistor (FET) device is readily commercially implemented.

In accord with the objects of the present invention, there is provided by the present invention a split gate field effect transistor (FET) device and a method for fabricating the split gate field effect transistor (FET) device. To practice the method of the present invention, there is first provided a semiconductor substrate having formed therein a pair of isolation regions which bound a pair of opposite sides of an active region of the semiconductor substrate. There is then formed upon the active region of the semiconductor substrate a tunneling dielectric layer. There is then forming upon the tunneling dielectric layer and spanning over the pair of isolation regions an annular shaped floating gate electrode defining a central open annular region. There is then formed upon the floating gate electrode an inter-gate electrode dielectric layer. There is then formed upon the inter-gate electrode dielectric layer and filling the central open annular region a control gate electrode. There is then formed into the semiconductor substrate adjacent a pair of opposite edges of the floating gate electrode not bounded by the pair of isolation regions a pair of source/drain regions. Within the present invention, at least one of: (1) the annular shaped floating gate electrode is formed with a spacer shaped cross-section having a tip at its upper outer periphery; and (2) the pair of source/drain regions is formed with one of the pair of source/drain regions formed further beneath the annular shaped floating gate electrode than the other of the pair of source/drain regions.

The method for fabricating the split gate field effect transistor (FET) device in accord with the present invention contemplates the split gate field effect transistor (FET) device fabricated in accord with the method for fabricating the split gate field effect transistor (FET) device in accord with the present invention.

The present invention provides a method for fabricating within a semiconductor integrated circuit microelectronic fabrication, and in particular within a non-volatile semiconductor integrated circuit microelectronic memory fabrication, a split gate field effect transistor (FET) device, along with the split gate field effect transistor (FET) device fabricated employing the method, wherein the split gate field effect transistor (FET) device is fabricated with enhanced properties.

The present invention realizes the foregoing objects by employing within a split gate field effect transistor (FET) device comprising: (1) an annular shaped floating gate electrode formed upon a tunneling dielectric layer in turn formed upon an active region of a semiconductor substrate bounded at a pair of opposite sides by a pair of isolation regions over which also spans the annular floating gate electrode; and (2) a pair of source/drain regions formed within the active region of the semiconductor substrate adjacent a pair of opposite sides of the annular shaped floating gate electrode but not bounded by the pair of isolation regions, at least one of: (1) the annular shaped floating gate electrode formed with a spacer shaped cross-section having a tip at its upper outer periphery; and (2) the pair of source/drain regions formed with one of the pair of source/drain regions formed further beneath the annular shaped floating gate electrode than the other of the pair of source/drain regions.

The method of the present invention is readily commercially implemented. A split gate field effect transistor (FET) device fabricated in accord with the present invention may be fabricated employing methods and materials as are generally known in the art of semiconductor integrated circuit microelectronic fabrication, including but not limited to non-volatile semiconductor integrated circuit microelectronic memory fabrication, but employed within the context of a novel ordering and sequencing of process steps to provide a split gate field effect transistor (FET) device, and method for fabrication thereof, in accord with the present invention. Since it is thus a novel ordering and sequencing of process steps which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic plan-view diagram illustrating, within a semiconductor integrated circuit microelectronic fabrication, a split gate field effect transistor (FET) device at an intermediate stage in its fabrication in accord with a preferred embodiment of the present invention.

FIG. 2A, FIG. 2B, FIG. 2C, FIG. 2D and FIG. 2E show a series of schematic cross-sectional diagrams illustrating, with respect to the semiconductor integrated circuit microelectronic fabrication whose schematic plan-view diagram is illustrated in FIG. 1, the results of progressive stages in fabrication of the split gate field effect transistor (FET) device whose schematic plan-view diagram is illustrated in FIG. 1.

FIG. 3A and FIG. 3B show a pair of schematic cross-sectional diagrams, through a cross-section perpendicular to the cross-section employed with respect to FIG. 2a to FIG. 2e, also illustrating, with respect to the semiconductor integrated circuit microelectronic fabrication whose schematic plan-view diagram is illustrated in FIG. 1, the results of progressive stages in fabrication of the split gate field effect transistor (FET) device whose schematic plan-view diagram is illustrated in FIG. 1.

DESCRIPTION OF THE PREFERRED EMBODIMENT

Figure 2C:
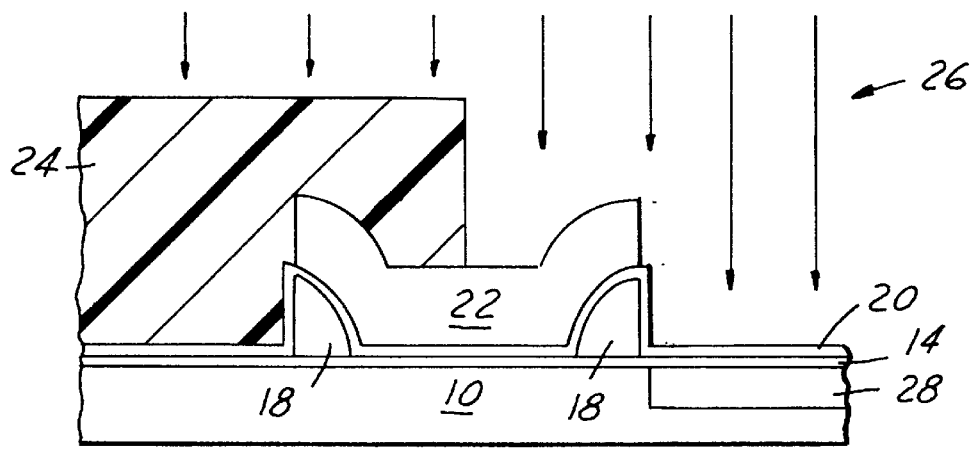

The present invention provides a method for fabricating within a semiconductor integrated circuit microelectronic fabrication, and in particular within a non-volatile semiconductor integrated circuit microelectronic memory fabrication, a split gate field effect transistor (FET) device, along with the split gate field effect transistor (FET) device fabricated employing the method, wherein the split gate field effect transistor (FET) device is fabricated with enhanced properties.

The present invention realizes the foregoing objects by employing within a split gate field effect transistor (FET) device comprising: (1) an annular shaped floating gate electrode formed upon a tunneling dielectric layer in turn formed upon an active region of a semiconductor substrate bounded at a pair of opposite sides by a pair of isolation regions over which also spans the annular floating gate electrode; and (2) a pair of source/drain regions formed within the active region of the semiconductor substrate and adjacent the annular shaped floating gate electrode but not bounded by the pair of isolation regions, at least one of: (1) the annular shaped floating gate electrode formed with a spacer shaped cross-section having a tip at its upper outer periphery; and (2) the pair of source/drain regions formed with one of the pair of source/drain regions formed further beneath the annular shaped floating gate electrode than the other of the pair of source/drain regions.

A split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) semiconductor integrated circuit microelectronic memory fabrication such as but not limited to a flash memory fabrication.

Referring now to FIG. 1, there is shown a schematic plan-view diagram illustrating, within a semiconductor integrated circuit microelectronic fabrication, a split gate field effect transistor (FET) device at an intermediate stage in its fabrication in accord with a preferred embodiment of the present invention.

Shown in FIG. 1 formed within and upon a semiconductor substrate which provides a substrate for the split gate field effect transistor (FET) device of the present invention is a pair of isolation regions 12a and 12b which defines an active region of the semiconductor substrate, where the active region of the semiconductor substrate in turn has formed thereupon a tunneling dielectric layer 14. Shown also within the schematic plan-view diagram of FIG. 1 formed upon the tunneling dielectric layer 14 while spanning over and also being formed upon or over the pair of isolation regions 12a and 12b is a floating gate electrode 18 which is formed in an annular shape. Although the schematic plan view diagram of FIG. 1 illustrates the floating gate electrode 18 formed in a circular annular shape, a floating gate electrode formed within a split gate field effect transistor (FET) device in accord with the present invention may be formed in any of several annular shapes, including but not limited to circular annular shapes, triangular annular shapes, square annular shapes, rectangular annular shapes, higher order polygonal annular shapes and irregular annular shapes, provided that the floating gate electrode with the annular shape is formed upon a tunneling dielectric layer formed upon an active region of a semiconductor substrate which in turn is defined by a pair of isolation regions over which in turn spans the floating gate electrode formed in the annular shape.

Referring now to FIG. 2A to FIG. 2E and to FIG. 3A to FIG. 3B, there is shown a series of schematic cross-sectional diagrams, taken through the corresponding cross-sections 2—2 and 3—3 as illustrated within the schematic plan-view diagram of FIG. 1, illustrating, with respect to the semiconductor integrated circuit microelectronic fabrication whose schematic plan-view diagram is illustrated in FIG. 1, the results of progressive stages of a complete processing, in accord with the preferred embodiment of the present invention, of the split gate field effect transistor (FET) device whose schematic plan-view diagram is illustrated in FIG. 1.

Shown in FIG. 2A and FIG. 3A is a pair of schematic cross-sectional diagrams of the semiconductor integrated circuit microelectronic fabrication at an early stage in fabrication therein of the split gate field effect transistor (FET) device of the preferred embodiment of the present invention.

Shown within FIG. 2A and FIG. 3A is a semiconductor substrate 10 having formed therein the pair of isolation regions 12a and 12b which define the active region of the semiconductor substrate 10. In turn, the active region of the semiconductor substrate 10 has formed thereupon the tunneling dielectric layer 14, as illustrated within the schematic plan-view diagram of FIG. 1.

Within the preferred embodiment of the present invention with respect to the semiconductor substrate 10, and although it is known in the art of semiconductor integrated circuit microelectronic fabrication that semiconductor substrates are available with either dopant polarity, several dopant concentrations and various crystallographic orientations, for the preferred embodiment of the present invention, the semiconductor substrate 10 is typically and preferably a (100) silicon semiconductor substrate having an N- or P-doping.

Similarly, within the preferred embodiment of the present invention with respect to the pair of isolation regions 12a and 12b, and although it is also known in the art of semiconductor integrated circuit microelectronic fabrication that isolation regions may be formed employing methods including but not limited to isolation region thermal growth methods and isolation region deposition/patterning methods, for the preferred embodiment of the present invention, the pair of isolation regions 12a and 12b is, as is illustrated particularly within the schematic cross-sectional diagram of FIG. 3A, typically and preferably formed employing an isolation region deposition/patterning method, to form the pair of isolation regions 12a and 12b as a pair of shallow trench isolation (STI) regions, typically and preferably formed at least in part of a silicon oxide dielectric material.

Yet similarly, within the preferred embodiment of the present invention with respect to the tunneling dielectric layer 14, and although it is also known in the art of semiconductor integrated circuit microelectronic fabrication that tunneling dielectric layers may be formed of dielectric materials including but not limited to silicon oxide dielectric materials, silicon nitride dielectric materials, silicon oxynitride dielectric materials, laminates thereof and aggregates thereof, for the preferred embodiment of the present invention, the tunneling dielectric layer 14 is typically and preferably formed at least in part of a silicon oxide dielectric material formed upon the active region of the semiconductor substrate 10.

Shown also within the schematic cross-sectional diagrams of FIG. 2A and FIG. 3A, and formed upon the isolation regions 12a and 12b and the tunneling dielectric layer 14 is a patterned sacrificial layer 16 to which is formed adjoining a sidewall thereof the floating gate electrode 18.

Within the preferred embodiment of the present invention with respect to the patterned sacrificial layer 16, the patterned sacrificial layer 16 is formed of a sacrificial material which is selectively etchable with respect to the materials from which are formed the isolation regions 12a and 12b, the tunneling dielectric layer 14 and the floating gate electrode 18. Within the preferred embodiment of the present invention, and although other materials may be employed for forming the patterned sacrificial layer 16, the patterned sacrificial layer 16 is typically and preferably formed of a silicon nitride material, under circumstances where at least the exposed portions of the isolation regions 12a and 12b and the tunneling dielectric layer 14 are formed of a silicon oxide material. Typically and preferably, the patterned sacrificial layer 16 is formed to a conventional thickness, to define an aperture which may be of minimal lithographic resolution, to which is formed adjoining a sidewall thereof the floating gate electrode 18.

Finally, within the preferred embodiment of the present invention with respect to the floating gate electrode 18, the floating gate electrode 18 may be formed of floating gate electrode materials as are conventional in the art of semiconductor integrated circuit microelectronic fabrication, including but not limited to metal, metal alloy, doped polysilicon (having a dopant concentration of greater than about 1E18 dopant atoms per cubic centimeter) and polycide (doped polysilicon/metal silicide stack) floating gate electrode materials, although doped polysilicon floating gate electrode materials are preferred. As is understood by a person skilled in the art, the floating gate electrode 18 as illustrated within the schematic plan-view diagram of FIG. 1, the schematic cross-sectional diagram of FIG. 2A and the schematic cross-sectional diagram of FIG. 3A is typically and preferably formed employing an anisotropic etching of a blanket floating gate electrode material layer formed upon the patterned sacrificial layer 16 and filling the aperture defined by the patterned sacrificial layer 16. By employing such a method in accord with the preferred embodiment of the present invention, and as is illustrated within the schematic cross-sectional diagram of FIG. 2A and FIG. 3A, the floating gate electrode 18 in addition to being formed of the annular shape defining a central open annular region as illustrated within the schematic plan-view diagram of FIG. 1, is formed with a cross-section of a spacer shape with a tip at its upper outer periphery. Typically and preferably, when the aperture defined by the patterned sacrificial layer 16 has an aperture width W1, the floating gate electrode 18 may be formed with a linewidth W2 to leave remaining the central open annular region of aperture width W3, as illustrated within the schematic cross-sectional diagram of FIG. 2A.

Referring now to FIG. 2B and FIG. 3B, there is shown a pair of schematic cross-sectional diagrams illustrating the results of further processing of the semiconductor integrated circuit microelectronic fabrication whose pair of schematic cross-sectional diagrams is illustrated within FIG. 2A and FIG. 3A.

Shown in FIG. 2B and FIG. 3B is a pair of schematic cross-sectional diagrams corresponding with the pair of schematic cross-sectional diagrams as illustrated within FIG. 2A and FIG. 3A, but wherein, in a first instance, the patterned sacrificial layer 16 has been stripped from the semiconductor integrated circuit microelectronic fabrication.

Within the preferred embodiment of the present invention, the patterned sacrificial layer 16 as illustrated within the pair of schematic cross-sectional diagrams of FIG. 2A and FIG. 3A may be stripped to provide in part the pair of semiconductor integrated circuit microelectronic fabrications whose pair of schematic cross-sectional diagrams is illustrated in FIG. 2B and FIG. 3B, while employing stripping methods as are conventional in the art of semiconductor integrated circuit microelectronic fabrication, which under circumstances where the patterned sacrificial layer 16 is formed of a silicon nitride sacrificial material will typically and preferably employ an aqueous phosphoric acid stripper material at an elevated temperature.

Shown also within the pair of schematic cross-sectional diagrams of FIG. 2B and FIG. 3B is a blanket inter-gate electrode dielectric layer 20 formed upon exposed portions of the isolation regions 12a and 12b, the tunneling dielectric layer 14 and the floating gate electrode 18.

Within the preferred embodiment of the present invention with respect to the blanket inter-gate electrode dielectric layer 20, the blanket inter-gate electrode dielectric layer 20 may be formed of dielectric materials as are conventional in the art of semiconductor integrated circuit microelectronic fabrication, including but not limited to silicon oxide dielectric materials, silicon nitride dielectric material, silicon oxynitride dielectric materials, laminates thereof and aggregates thereof. Typically and preferably, the blanket inter-gate electrode dielectric layer 20 is formed to a conventional thickness upon exposed portions of the isolation regions 12a and 12b, the tunneling dielectric layer 14 and the floating gate electrode 18.

Finally, there is also shown within the pair of schematic cross-sectional diagrams of FIG. 2B and FIG. 3B, and formed upon the blanket inter-gate electrode dielectric layer 20, a patterned control gate electrode 22 which spans over the pair of isolation regions 12a and 12b in accord with the schematic cross-sectional diagram of FIG. 3B to provide a contiguous patterned control gate electrode 22 with respect to adjacent split gate field effect transistor (FET) devices, but does not span over the active region of the semiconductor substrate in accord with the schematic cross-sectional diagram of FIG. 2B. As is illustrated within the schematic cross-sectional diagrams of FIGS. 2B and 3B, the patterned control gate electrode 22 completely covers a portion of the tip (i.e., both top part and sidewall part of the portion of the tip) at the upper outer periphery of the annular shaped floating gate electrode 18.

Within the preferred embodiment of the present invention, the patterned control gate electrode 22 may be formed employing methods and materials analogous or equivalent to the methods and materials as are employed for forming the floating gate electrode 18. Typically and preferably, the patterned control gate electrode 22 is formed to a conventional thickness.

Referring now to FIG. 2C, there is shown a schematic cross-sectional diagram illustrating the results of further processing of the semiconductor integrated circuit microelectronic fabrication whose schematic cross-sectional diagram is illustrated in FIG. 2B.

Shown in FIG. 2C is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2B, but wherein, in a first instance, there is formed a patterned first photoresist layer 24 covering approximately half of the patterned control gate electrode 22 and approximately half of the floating gate electrode 18.

Within the preferred embodiment of the present invention, the patterned first photoresist layer 24 may be formed of photoresist materials as are conventional in the art of semiconductor integrated circuit microelectronic fabrication, including but not limited to photoresist materials selected from the general groups of photoresist materials including but not limited to positive photoresist materials and negative photoresist materials. Typically and preferably, the patterned first photoresist layer 24 is formed to a conventional thickness.

Shown also within the schematic cross-sectional diagram of FIG. 2C is the results of forming within a portion of the active region of the semiconductor substrate 10 adjacent the floating gate electrode 18, and while employing the patterned first photoresist layer 24 as a first ion implantation mask in conjunction with a dose of first implanting ions 26, a first source/drain region 28.

Within the preferred embodiment of the present, the dose of first implanting ions 26 is typically and preferably provided employing a conventional ion implantation dose, to provide the first source/drain region 28 within the active region of the semiconductor substrate 10 adjacent the floating gate electrode 18.

Figure 2D:
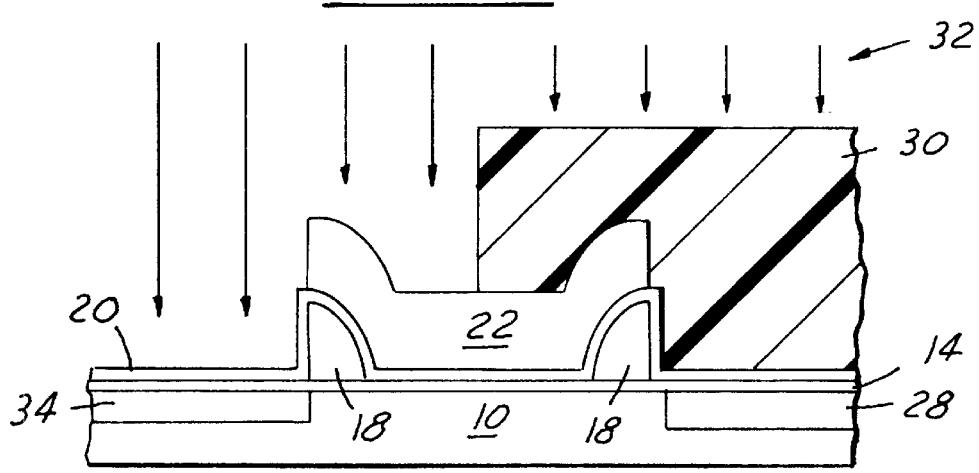

Referring now to FIG. 2D, there is shown a schematic cross-sectional diagram illustrating the results of further processing of the semiconductor integrated circuit microelectronic fabrication whose schematic cross-sectional diagram is illustrated in FIG. 2C.

Shown in FIG. 2D is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2C, but wherein after stripping therefrom the patterned first photoresist layer 24 an alternative half of the control gate electrode 22 and an alternative half of the floating gate electrode 18 are masked with a patterned second photoresist layer 30, and there is implanted into a second portion of the active region of the semiconductor substrate 10 separated from the first source/drain region 28 by the floating gate electrode 18, a second source/drain region 34, while employing a dose of second implanting ions 32.

Within the preferred embodiment of the present invention, the dose of second implanting ions 32 is typically and preferably provided employing ion implantation parameters as are analogous or equivalent to the ion implantation parameters as are employed for forming the first source/drain electrode 28, but with a second dopant of inhibited thermal diffusivity in comparison with the first dopant as employed for forming the first source/drain region 28.

Figure 2E:
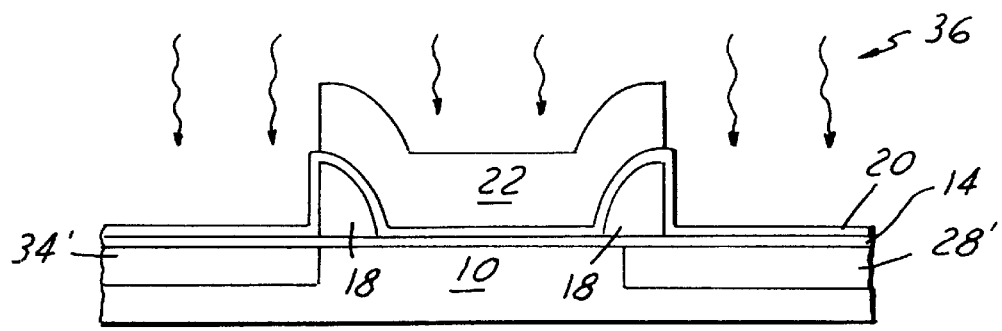

Referring now to FIG. 2E, there is shown a schematic cross-sectional diagram illustrating the results of further processing of the semiconductor integrated circuit microelectronic fabrication whose schematic cross-sectional diagram is illustrated in FIG. 2D.

Shown in FIG. 2E is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2D, but wherein after stripping therefrom the patterned second photoresist layer 30 the semiconductor integrated circuit microelectronic fabrication has been thermally annealed within a thermal annealing environment 36, to form from the first source/drain region 28 and the second source/drain region 34 a corresponding thermally annealed first source/drain region 28' and a corresponding thermally annealed second source/drain region 34'. Within the preferred embodiment of the present invention with respect to the thermal annealing environment 36, typically and preferably, the thermal annealing environment 36 is provided at a conventional temperature for a conventional time period. As is further illustrated within the schematic cross-sectional diagram of FIG. 2e, the thermally annealed first source/drain region 28' is diffused beneath the floating gate electrode 18 a greater distance than is the thermally annealed second source/drain region 34' diffused beneath the floating gate electrode 18, since the first dopant ions within the dose of first implanting ions 26 has a greater thermal diffusivity than the second dopant ions within the dose of second implanting ions 32.

As is understood by a person skilled in the art, within the split gate field effect transistor (FET) device whose schematic cross-sectional diagram is illustrated in FIG. 2E, the thermally diffused first source/drain region 28' typically and preferably serves as a source region which is further thermally diffused beneath the floating gate electrode to provide for enhanced coupling ratio with the floating gate electrode 18. Similarly, the thermally diffused second source/drain region 34' typically and preferably serves as a bit line within the split gate field effect transistor (FET) device.

As is further understood by a person skilled in the art, it is also plausible within the present invention not to employ a masking of the patterned control gate electrode 22 and the floating gate electrode 18 in accord with the schematic cross-sectional diagrams of FIG. 2C and FIG. 2D, but rather to form within the active region of the semiconductor substrate 10 a pair of source/drain regions (corresponding with the first source/drain region 28 and the second source/drain region 34) while employing a single ion implant method employing a single dose of a single implanting ion.

Similarly, it is also plausible within the present invention, under circumstances where asymmetric thermally annealed source/drain regions are formed in accord with the schematic cross-sectional diagrams of FIG. 2C to FIG. 2E, to employ a floating gate electrode of cross-sectional shape other than as illustrated within the schematic cross-sectional diagram of FIG. 2A to FIG. 2E and FIG. 3A to FIG. 3B.

Upon forming within the semiconductor integrated circuit microelectronic fabrication whose schematic cross-sectional diagram is illustrated in FIG. 2E the split gate field effect transistor (FET) device in accord with the preferred embodiment of the present invention, the split gate field effect transistor (FET) device is formed with reduced dimensions and/or with enhanced performance insofar as the split gate field effect transistor (FET) device is formed with at least one of: (1) a spacer shaped annular floating gate electrode which may be formed employing a self aligned method with respect to a minimally dimensioned aperture within a patterned sacrificial layer; and (2) a pair of source/drain regions asymmetrically extending beneath opposite sidewalls of the annular floating gate electrode such as to provide enhanced coupling of one of the source/drain regions with respect to a floating gate electrode.

As is understood by a person skilled in the art, the preferred embodiment of the present invention is illustrative of the present invention rather than limiting of the present invention. Revisions and modifications may be made to methods, structures and dimensions through which is provided within a semiconductor integrated circuit microelectronic fabrication a split gate field effect transistor (FET) device in accord with the preferred embodiment of the present invention while still providing within a semiconductor integrated circuit microelectronic fabrication a split gate field effect transistor (FET) device, and a method for fabrication thereof, in accord with the present invention, further in accord with the accompanying claims.

What is claimed is:

1. A method for fabricating a split gate field effect transistor (FET) device comprising:

providing a semiconductor substrate having formed therein a pair of isolation regions which bounds a pair of opposite sides of an active region of the semiconductor substrate;

forming upon the active region of the semiconductor substrate a tunneling dielectric layer;

forming upon the tunneling dielectric layer and spanning over the pair of isolation regions an annular shaped floating gate electrode defining a central open annular region;

forming upon the floating gate electrode an inter-gate electrode dielectric layer;

forming upon the inter-gate electrode dielectric layer and filling the central open annular region a control gate electrode; and forming into the semiconductor substrate adjacent a pair of opposite edges of the floating gate electrode not bounded by the pair of isolation regions a pair of source/drain regions, wherein the annular shaped floating gate electrode is formed with a spacer shaped cross-section having a tip at its upper outer periphery.

2. The method of claim 1 wherein the annular shaped floating gate electrode is formed of an annular shape selected from the group consisting of circular annular shapes, triangular annular shapes, square annular shapes, rectangular annular shapes, higher order polygonal annular shapes and irregular annular shapes.

3. The method of claim 1 wherein the annular shaped floating gate electrode is formed employing an anisotropic etching of a blanket floating gate electrode material layer formed within an aperture defined by a patterned sacrificial layer.

4. The method of claim 1 wherein the pair of source/drain regions is formed with one of the pair of source/drain regions formed further beneath the annular shaped floating gate electrode than the other of the pair of source/drain regions.

5. The method of claim 4 wherein each of the pair of source/drain regions is formed employing a separate dopant.

6. The method of claim 1 wherein the control gate electrode completely covers a portion of the tip of the floating gate electrode.

7. A split gate field effect transistor (FET) device comprising:

a semiconductor substrate having formed therein a pair of isolation regions which bound a pair of opposite sides of an active region of the semiconductor substrate;

a tunneling dielectric layer formed upon the active region of the semiconductor substrate;

an annular floating gate electrode formed upon the tunneling dielectric layer and spanning over the pair of isolation regions, the annular shaped floating gate electrode defining a central open annular region;

an inter-gate electrode dielectric layer formed upon the floating gate electrode;

a control gate electrode formed upon the inter-gate electrode dielectric layer and filling the central open annular region; and a pair of source/drain regions formed into the semiconductor substrate adjacent a pair of opposite edges of the floating gate electrode not bounded by the pair of isolation regions, wherein the annular shaped floating gate electrode is formed with a spacer shaped cross-section having a tip at its upper outer periphery.

8. The split gate field effect transistor (FET) device of claim 7 wherein the annular shaped floating gate electrode is formed of an annular shape selected from the group consisting of circular annular shapes, triangular annular shapes, square annular shapes, rectangular annular shapes, higher order polygonal annular shapes and irregular annular shapes.

9. The split gate field effect transistor (FET) device of claim 7 wherein the pair of source/drain regions is formed with one of the pair of source/drain regions formed further beneath the annular shaped floating gate electrode than the other of the pair of source/drain regions.

10. The split gate field effect transistor (FET) device of claim 9 wherein each of the pair of source/drain regions is formed employing a separate dopant.

11. The split gate field effect transistor (FET) device of claim 7 wherein the control gate electrode completely covers a portion of the tip of the floating gate electrode.

* * * * *